United States Patent [19]

Shirono et al.

[11] 4,350,098

[45] Sep. 21, 1982

[54] TEST RACK FOR ELECTRONIC EQUIPMENT

[75] Inventors: Junkichi Shirono; Katsuhisa Honda, both of Tokyo, Japan

[73] Assignee: Anritsu Electric Company Limited, Tokyo, Japan

[21] Appl. No.: 159,882

[22] Filed: Jun. 16, 1980

[30] Foreign Application Priority Data

Jun. 20, 1979 [JP] Japan .................................. 54-76737

[51] Int. Cl.³ .............................................. A47F 5/12
[52] U.S. Cl. ......................................... 108/6; 108/8; 248/242
[58] Field of Search ............................. 108/6, 7, 8, 1; 248/221.3, 242, 178, 122, 130, 185, 397; 403/93

[56] References Cited

U.S. PATENT DOCUMENTS

| 178,747 | 6/1876 | Eastman | 108/8 |
| 186,678 | 1/1877 | Horenstein | 108/8 X |
| 656,256 | 8/1900 | Lisenring | 108/8 |
| 2,776,102 | 1/1957 | Schlafly | 248/178 |
| 4,067,533 | 1/1978 | Kazaoka et al. | 248/397 |

FOREIGN PATENT DOCUMENTS 422043 1/1935 United Kingdom .................... 108/8

Primary Examiner—James T. McCall
Attorney, Agent, or Firm—Jordan and Hamburg

[57] ABSTRACT

A test rack for electronic equipment features an improved mechanism for inclining the test rack table in a smooth and effortless manner even when heavily loaded, with equipment. Notches provided on a stopper plate are allowed to mate with a stopper shaft by sliding the stopper plate along a guide portion when the table is set at a desired angle of inclination. The stopper plate is constrained to slide at substantially right angles to the stopper shaft at all times so that the stopper shafts engages squarely with the notches to preclude jamming when the mechanism is operated under a heavy load.

2 Claims, 6 Drawing Figures

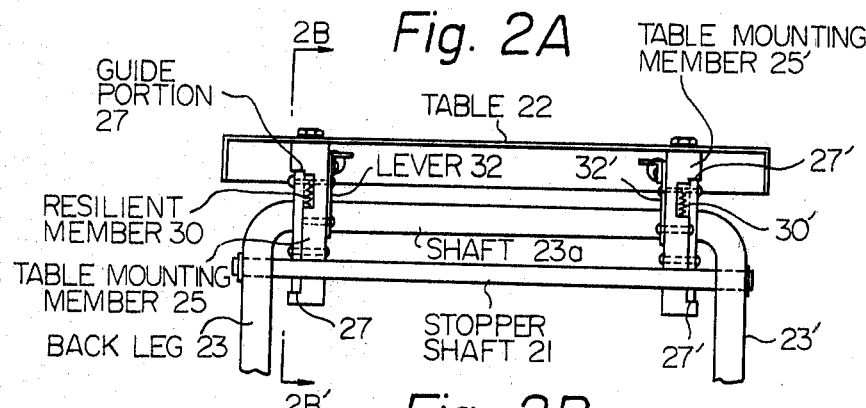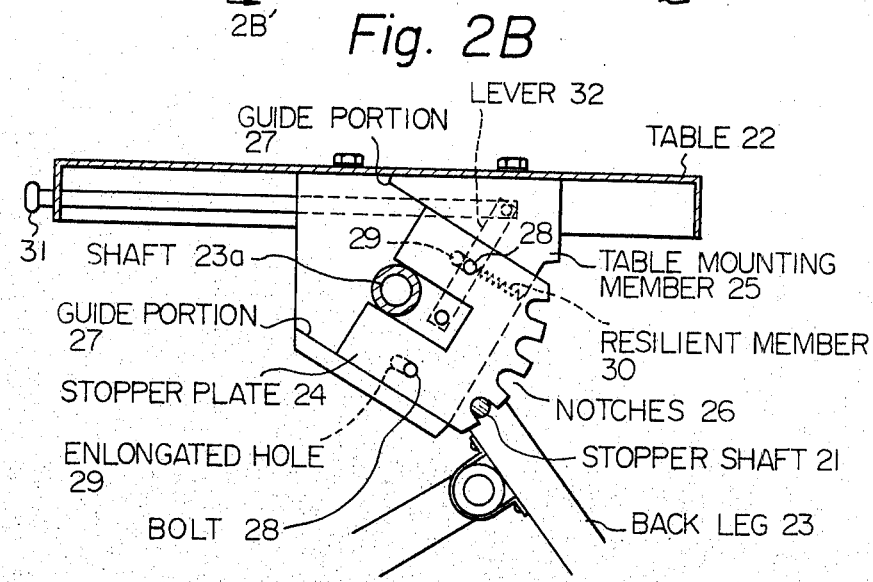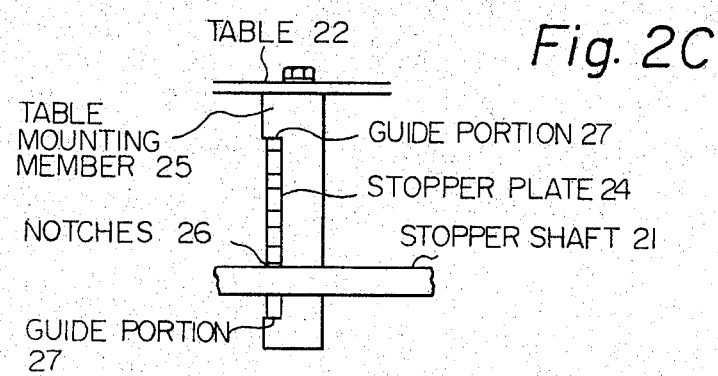

TEST RACK FOR ELECTRONIC EQUIPMENT

BACKGROUND OF THE INVENTION

This invention relates to a test rack for electronic equipment which is adapted such that the rack table on which the equipment is placed can be inclined through a simple and smooth operation.

Test racks of the type described are well known in the art, a typical example of which is shown in FIG. 1. Specifically, FIG. 1A shows the construction of a table inclination apparatus which is mounted on the bottom of the rack, FIG. 1B a front view of a stopper plate, and FIG. 1C a cross-sectional view showing a pin inserted into the stopper plate. The stopper plates 10, 10' are secured to test rack leg supports 12, 12', respectively, and have a plurality of holes 13 bored therethrough along one edge thereof, as illustrated in FIG. 1B. The pin 14, 14' are pivotally mounted at one end to each of cams 17, 17' so as to lie at right angles to the lever shaft 16 of a lever 15, and is adapted such that the other end thereof penetrates a hole 13 in the stopper plates 10, 10' by passing through a bearing hole 19 provided in the side of the table 18. In accordance with this conventional arrangement, pulling the lever 15 forward rocks the cams 17, 17' and causes the pin 14, 14' to move inwardly toward the center of the table 18 so that the tip of the pin is extracted from the hole 13 in the stopper plates 10, 10' thereby allowing the table to be tilted at a desired angle where it is then secured by releasing the lever 15, the latter being pulled back to its original attitude by a spring 20 so that the pin 14, 14' again slides into the prescribed hole 13 to lock the table 18 in place.

The disadvantage encountered in the conventional apparatus as described above is biting or scoring phenomenon that occurs between the pin 14, 14' and the hole 13 or between the pin and the hole 19 whenever a heavy load is placed upon the table 18, this phenomenon making it difficult to extract the pin 14, 14' from the holes. The result is that considerable force must be applied to the lever 15 to extract the pins before the table can be changed to another angle of inclination. One reason for the above problem is the perpendicular relationship between the pin 14, 14' and the direction in which the table 18 tilts. Specifically, the hole 13 and the hole 19 must be in perfect alignment owing to the perpendicular attitude of the pin 14, 14' with respect to the side of the table, but this alignment cannot be maintained when the heavy load is set upon the table. This misalignment of the holes causes the stopper plates 10, 10' and the side of the table to bite into the pin. Another reason is that sufficient play must be provided between the pin 14 and the bearing hole 19 since the pin is connected to the lever shaft 16 through the cam 17 and therefore undergoes arcuate motion as the cam rotates. This arrangement also invites the biting or scoring problem described above.

SUMMARY OF THE INVENTION

It is therefore a general object of the present invention to eliminate the disadvantage encountered in the prior art.

It is a specific object of the present invention to provide a test rack for electronic equipment, which test rack is provided with a table inclination apparatus that enables the table of the rack to be inclined in a simple and smooth manner.

The above objects are attained by an arrangement which includes a stopper shaft, a stopper plate having notches that engage with the stopper shaft, and a guide portion for slidably guiding the stopper plate, the stopper plate sliding at substantially right angles to the stopper shaft at all times so that the fit between the notches of the stopper plate is free of scoring and biting even when the rack table is heavily loaded.

Other and further objects, features and advantages of the present invention will appear more fully from the following detailed description of a preferred embodiment when considered together with the accompanying drawings.

BRIEF DESCRIPTION OF THE DRAWINGS

FIG. 2A is a view useful in describing the construction of a table inclination apparatus mounted below a table on a test rack according to the present invention, the test rack being viewed from the rear thereof;

FIG. 2B is a cross-sectional view of FIG. 2A taken along the line 2B—2B'; and

FIG. 2C is an enlarged view showing a stopper shaft which has been fit into a stopper plate employed in the apparatus of FIG. 2A.

DETAILED DESCRIPTION OF THE PREFERRED EMBODIMENT

Figure 1A:
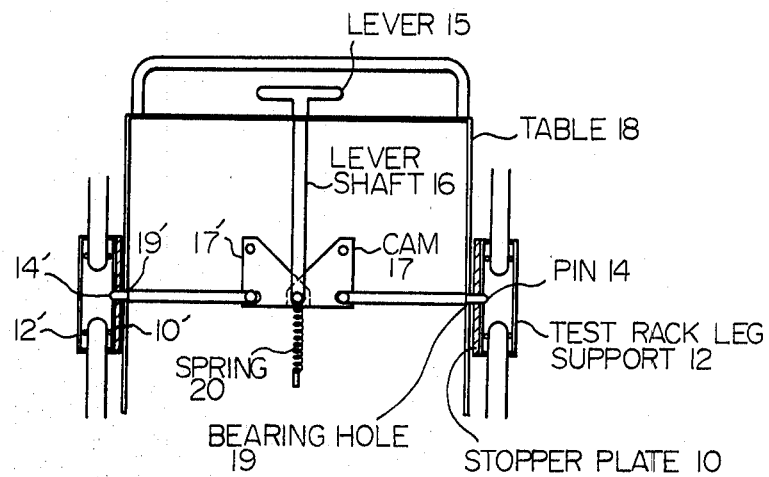
FIG. 1A is a view useful in describing the construction of a table inclination mechanism on a test rack according to the prior art.
Figure 1B:
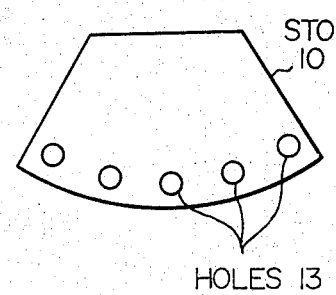
FIG. 1B is a front view of a stopper plate employed in the apparatus of FIG. 1A.
Figure 1C:
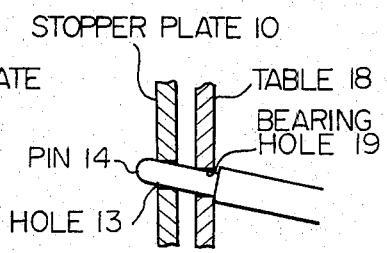
FIG. 1C is a cross-sectional view showing a pin inserted into the stopper plate of FIG. 1B.

Referring now to FIGS. 2A through 2B, a stopper shaft designated at 21 is secured between the back legs 23, 23' of a test rack so as to lie substantially in parallel with a shaft 23a. A stopper plate 24 includes at one end notches 26 into which the stopper shaft 21 is adapted to be fitted without play, and is attached to the lower portion of a table 22 in a plane substantially at right angles to the stopper shaft 21. Table mounting member 25, 25' are fixed to the lower portion of the table 22 and is adapted to rotate about the shaft 23a.

The table mounting member 25, 25' respectively include guide portions 27, 27' which lie in the abovementioned plane substantially at right angles to the stopper shaft 21. The guide portions 27, 27' slidably guide the stopper plate 24 in order to fit the stopper shaft 21 into the notches 26, as shown in FIG. 2C, and supports the stopper plate 24 without vertical play in said plane. The stopper plate 24 is attached to the table mounting member 25 by a bolt 28 which is passed through an elongated hole 29 formed in the mounting member 25, and the stopper plate 24 freely slides along the guide portion 27. The guide portion 27 and stopper plate 24 are adapted such that the sliding portion defined between them is of sufficient length to permit the stopper plate 24 to slide smoothly without biting or scoring even when a notch 26 is subjected to a heavy load via the stopper shaft 21.

A resilient member 30 such as a helical spring is attached to the table mounting member 25 and urge the stopper plate 24, or essentially the notch 26, toward the stopper shaft 21. A lever 31 interacts with a lever 32 connected to the stopper plate 24 to slide the same in a direction parallel to the direction of table rotation in a manner to be described.

Specifically, when the lever 31 is pulled forward, a lever 32 interconnected therewith pulls the stopper plate 24 in a direction which is parallel to the direction in which the table 22 rotates when tilted, whereby the stopper plate 24 is separated from the stopper shaft 21 to permit the table 22 to be rotated via the table mounting member 25. Thus, with the lever 31 pulled forward, the table 22 is inclined to bring a different notch 26, which corresponds to the desired angle of inclination, into the position opposite the stopper shaft 21, after which the lever 31 is released to allow the resilient member 30 to urge the stopper plate 24 toward the stopper shaft 21 so that the prescribed notch 26 firmly mates with the stopper shaft, thereby fixing the table at the new angle of inclination. No inconvenience results if the lever 31 is released during the table inclining operation since the spring 30 will always cause the nearest notch 26 to mate with the stopper shaft 21.

In accordance with the feature of the invention, the fit between the stopper plate 24 and stopper shaft 21 is free of biting or scoring, even under a heavy load, since the stopper plate and the stopper shaft are always substantially at right angles to each other. This is because the stopper plate 24 is allowed to slide in a direction which is parallel to the direction in which the table is tilted, and because the notches 26 in the stopper plate 24 and the guide portion 27 for slidably supporting the stopper plate are disposed in a plane which is substantially perpendicular to the stopper shaft 21 located below the table 22, that is, in a plane extending in the direction of the loading force that secures the table against rotation. Since the stopper plate support portion as well as the fitting portion between the stopper plate and the stopper shaft 21 both lie in this plane, only a compressive force and not a twisting force acts upon the stopper plate, thereby precluding biting or scoring even at the portion where it is retained. The result of the foregoing arrangement is smooth engagement and separation between the notches 26 in the stopper plate 24 and the stopper shaft 21 so that the lever 31 can be operated effortlessly with much less force than required with the conventional apparatus. The table 22 can therefore be inclined smoothly and easily even when carrying a heavy piece of test equipment.

It should be noted that while the present embodiment employs a single stopper shaft 21 extending from one leg of the rack to the other, separate stopper shafts can be provided for each stopper plate.

While the present invention has been described in some detail with regard to a preferred embodiment thereof, it is obvious that widely different embodiments of the invention can be made without departing from the spirit and scope thereof and that the invention is not limited to the specific embodiment except as defined in the appended claims.

What is claimed is:

1. A test rack for electronic equipment comprising:
a main shaft having leg portions;
a table pivotally mounted on said main shaft; and
a table inclination mechanism for inclining the table at a desired angle and securing the table at the desired angle;
said table inclination mechanism including a table mounting member rotatably supported by said main shaft and fixedly mounted on a lower side of said table in a plane at right angles to said main shaft, said table mounting member including first and second guide portions spaced from said main shaft and extending parallel to one another at a sufficient length, each of said guide portions being inclined at a predetermined angle relative to the plane of said table, a stopper shaft provided on said legs so as to lie in parallel with said main shaft, and a stopper plate including a plurality of notches along one edge aligned on a circle whose central point lies on a central axis of said main shaft for engaging with said stopper shaft and carried by said table mounting member in a plane perpendicular to said main shaft, said stopper plate being slidably guided by said first and second guide portions of said table mounting member along a path parallel to said predetermined angle relative to said table whereby selected one of said notches engages with said stopper shaft and a unitary structure of said stopper plate, said table mounting member and said table can be inclined around said main shaft when said stopper plate disengages from said stopper shaft, and means for sliding said stopper plate relative to said stopper shaft.

2. A test rack according to claim 1, in which said sliding means comprises lever means, and arm means having its one end connected to said lever means, an intermediate portion connected to said stopper plate and its another end pivotally connected to said support member, said arm means being movable by said lever means for thereby sliding said stopper plate relative to said stopper shaft.

* * * * *